United States Patent
Gipson et al.

(10) Patent No.: US 10,838,130 B2
(45) Date of Patent: Nov. 17, 2020

(54) LIGHT GUIDE WITH LIGHT REFLECTOR

(71) Applicant: Dura Operating, LLC, Auburn Hills, MI (US)

(72) Inventors: Ron Gipson, Metamora, MI (US); Bhanumurthy Veeragandham, Auburn Hills, MI (US)

(*) Notice: Subject to any disclaimer, the term of this patent is extended or adjusted under 35 U.S.C. 154(b) by 0 days.

(21) Appl. No.: 16/109,183

(22) Filed: Aug. 22, 2018

(65) Prior Publication Data
US 2020/0249387 A1  Aug. 6, 2020

(51) Int. Cl.
F21V 8/00 (2006.01)
(52) U.S. Cl.
CPC ......... *G02B 6/0021* (2013.01); *G02B 6/0031* (2013.01); *G02B 6/0065* (2013.01); *G02B 6/0083* (2013.01)
(58) Field of Classification Search
CPC .... G02B 6/0065; G02B 6/006; G02B 6/0073; G02B 6/0043; G02B 6/0091; G02B 6/0021; G02B 6/0031; G02B 6/0083; H05K 2201/10106; F21Y 2115/10; F21S 41/148; F21S 41/24; F21S 43/239
See application file for complete search history.

(56) References Cited

U.S. PATENT DOCUMENTS

| | | | |
|---|---|---|---|
| 4,151,582 A | 4/1979 | Grunberger | |
| 5,947,578 A | 9/1999 | Ayres | |
| 7,058,250 B2* | 6/2006 | Bachl | G02B 6/0021 385/15 |
| 8,317,366 B2* | 11/2012 | Dalton | B29C 70/585 362/296.01 |
| 9,403,477 B2* | 8/2016 | Richard | B32B 17/10541 |
| 9,565,278 B2* | 2/2017 | Yoo | H04M 1/0202 |
| 9,857,519 B2* | 1/2018 | Shani | G02B 6/0015 |
| 2007/0115687 A1 | 5/2007 | Verweg et al. | |
| 2012/0326634 A1* | 12/2012 | Li | H05B 33/0803 315/312 |
| 2018/0052272 A1* | 2/2018 | Cornelissen | G02B 6/0021 |

* cited by examiner

*Primary Examiner* — Peggy A Neils
(74) *Attorney, Agent, or Firm* — Vivacqua Crane PLLC (57) ABSTRACT

A molded component assembly includes a printed circuit board with a first face and a second face, and multiple through apertures. Multiple light emitting diodes are mounted on a first portion of the first face. A light guide of a light translucent polymeric material is positioned proximate to the light emitting diodes. The light guide includes: a contact surface directly contacting the first portion of the first face; multiple light outlets, each aligned to receive visible light emitted from one of the light emitting diodes; and multiple integrally formed light reflectors. Each light reflector extends into one of the light outlets and over one of the through apertures, and each includes a first reflector surface, a second reflector surface and a third reflector surface each oriented non-orthogonal to the contact surface to reflect light from one of the light emitting diodes into one of the light outlets.

18 Claims, 7 Drawing Sheets

LIGHT GUIDE WITH LIGHT REFLECTOR

FIELD

The present disclosure relates generally to printed circuit boards having at least one light generating component and a light guide.

BACKGROUND

The statements in this section merely provide background information related to the present disclosure and may or may not constitute prior art.

Electronic assemblies with backlit visual elements may be manufactured via several processes. Most commonly, a plastic part of a polymeric material resin is molded with some portion of the plastic being clear or translucent, with electronics components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronics components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, and then insert the formed film into an injection mold having substantially the same shape. A following step injection-molds plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronics components may also be printed onto a film. The film is then inserted into an injection mold, where plastic is molded onto the film, the electronics components being embedded in the molded plastic so that when the plastic part is removed from the mold the film is peeled away from the plastic part, leaving the electronics components embedded in or adhered to the surface of the plastic part.

Thus, while current printed film assemblies achieve their intended purpose, there is a need for a new and improved system and method for preparing light guides used for film assemblies having light emitting diodes.

SUMMARY

According to several aspects, a molded component assembly includes a printed circuit board with a first face and an oppositely facing second face. Multiple light emitting diodes are mounted on a first portion of the first face. A light guide of a light translucent polymeric material is positioned proximate to the light emitting diodes. The light guide includes: a contact surface directly contacting the first portion of the first face; multiple light outlets, each aligned to receive visible light emitted from one of the light emitting diodes; and multiple integrally formed light reflectors, each positioned proximate to one of the light outlets and each including at least a first reflector surface that is non-orthogonal to the contact surface to reflect light from one of the light emitting diodes into one of the light outlets.

In another aspect of the present disclosure, multiple electronics components are mounted on a second portion of the first face; and a first polymeric material is molded over the second portion of the first face encapsulating the electronics components and contacting a portion of the light guide.

In another aspect of the present disclosure, the printed circuit board includes multiple through apertures extending from the first face to the second face, with each of the light outlets aligned with one of the through apertures. A distal end of each of the light reflectors defines a substantially flat face having a geometry that substantially matches a geometry of individual ones of the through apertures, with the distal end positioned substantially flush with the second face of the printed circuit board.

In another aspect of the present disclosure, the printed circuit board includes multiple through apertures extending from the first face to the second face, with each of the light outlets aligned with one of the through apertures. A distal end of each of the light reflectors defines a substantially flat face having a geometry that substantially matches a geometry of individual ones of the through apertures, with the distal end spaced apart from the second face of the printed circuit board.

In another aspect of the present disclosure, the at least a first reflector surface includes a second reflector surface and a third reflector surface that are each non-orthogonal with the contact surface.

In another aspect of the present disclosure, the second reflector surface and the third reflector surface are each positioned proximate to and intersect with the first reflector surface.

In another aspect of the present disclosure, the second reflector surface and the third reflector surface each include an edge oriented parallel with the edge of the other one of the second or the third reflector surfaces.

In another aspect of the present disclosure, the first reflector surface, the second reflector surface and the third reflector surface define an edge of the light guide.

In another aspect of the present disclosure, a fourth reflector surface is positioned proximate to each of the first reflector surface, the second reflector surface and the third reflector surface, the fourth reflector surface oriented substantially parallel to the contact surface.

In another aspect of the present disclosure, the light guide includes multiple light emitting diode receiving pockets recessed into the contact surface, the pockets each having a shape corresponding to a shape of the light emitting diodes and each sized to receive one of the light emitting diodes when the contact surface directly contacts the first portion of the first face.

In another aspect of the present disclosure, the incident surface includes a texture to control transmission of the visible light to the light guide.

In another aspect of the present disclosure, a recess portion is formed in the light guide, the first reflector surface defining a portion of the recess portion.

In another aspect of the present disclosure, the light guide includes multiple neck portions each positioned between one of the light reflectors and a body of the light guide, each neck portion transmitting visible light from one of the light emitting diodes to one of the light reflectors.

According to several aspects, a molded component assembly includes a printed circuit board with a first face and an oppositely facing second face, and multiple through apertures extending from the first face to the second face. Multiple light emitting diodes are mounted on a first portion of the first face. A light guide of a light translucent polymeric material is positioned proximate to the light emitting diodes. The light guide includes: a contact surface directly contacting the first portion of the first face; multiple light outlets, each aligned to receive visible light emitted from one of the light emitting diodes; and multiple integrally formed light reflectors, each extending into one of the light outlets and over one of the through apertures, and each including a first reflector surface, a second reflector surface and a third reflector surface each oriented non-orthogonal to the contact surface to reflect light from one of the light emitting diodes into one of the light outlets.

In another aspect of the present disclosure, a fourth reflector surface positioned proximate to each of the first reflector surface, the second reflector surface and the third reflector surface, the fourth reflector surface oriented substantially parallel to the contact surface, wherein the first reflector surface, the second reflector surface, the third reflector surface and the fourth reflector surface together define an edge of the light guide.

In another aspect of the present disclosure, each of the light emitting diodes defines a side-firing diode having visible light emitted from the light emitting diodes directed generally parallel to the first face.

In another aspect of the present disclosure, each of the multiple light reflectors is homogeneously connected to the light guide and each includes a neck portion extending the light reflector at least partially into one of the through apertures.

In another aspect of the present disclosure, multiple electronics components are mounted on a second portion of the first face. A first polymeric material is molded over the second portion of the first face encapsulating the electronics components and contacting a portion of the light guide. A second polymeric material is over-molded over the light guide and over the first polymeric material. A substantially opaque layer of a polymeric material is positioned over the second face of the printed circuit board having translucent openings positioned over each of the through apertures, the translucent openings defining successive number pairs.

According to several aspects, a molded component assembly includes a printed circuit board with a first face and an oppositely facing second face, and multiple through apertures extending from the first face to the second face. Multiple side firing light emitting diodes are mounted on a first portion of the first face each directing visible light substantially parallel to the first face. Multiple electronics components are mounted on a second portion of the first face. A light guide of a light translucent polymeric material includes: a contact surface; multiple light reflectors each extending at least partially into one of the through apertures to create a light outlet from each of the light reflectors; and multiple light emitting diode receiving pockets defining recesses in the contact surface, each sized to receive one of the light emitting diodes when the contact surface directly contacts the first portion of the first face, with visible light from the light emitting diodes transmitted through the light reflectors and out via each light outlet. The multiple light reflectors each include multiple beveled surfaces to reflect the visible light to the light outlets.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
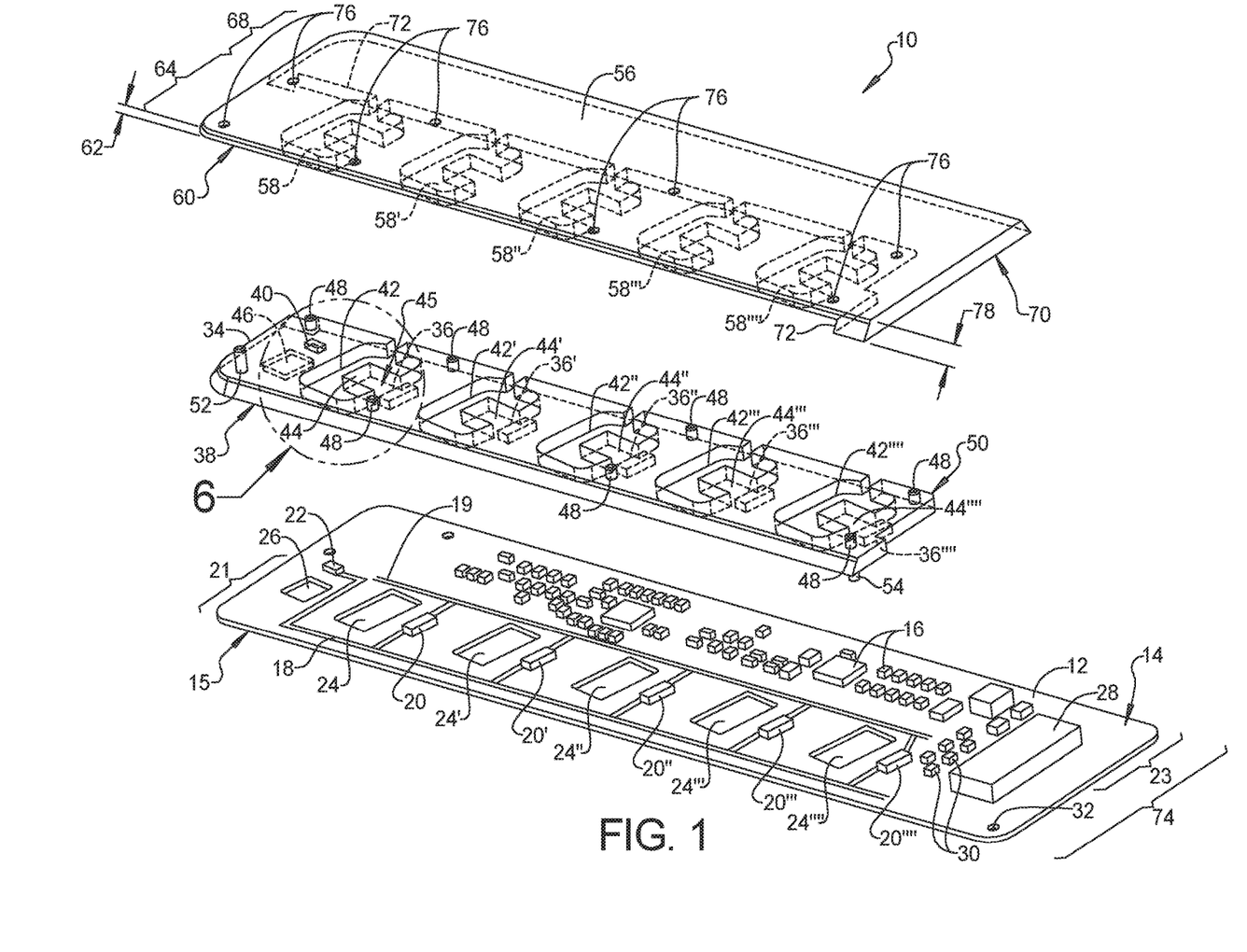
FIG. 1 is a front perspective assembly view of a molded component assembly according to an exemplary embodiment.

Referring to FIG. 1, a laminated light guide and component carrier defining a molded component assembly 10 includes a molded polymeric material or a metal body 12 such as a printed circuit board having multiple electrical components mounted thereon. According to several aspects, the body 12 defines a rectangular shape, however any desired geometric shape may be used. The body 12 includes a first side or first face 14 and an oppositely directed second face 15. On the first face 14 of the body 12 are located multiple electronics components 16 including capacitors, which are electrically connected to a plurality of first electrical traces 18, 19 (only partially shown for clarity) printed for example by a screen printing process onto the first face 14.

Multiple light emitting diodes 20, 20', 20", 20'", 20"" are also individually mounted on a first portion 21 of the first face 14 and are connected to the electrical traces 18, 19. An additional light emitting diode 22 can optionally be provided at one end of the first portion 21 of the first face 14 of the body 12 to provide an illuminated indication that electrical power is available for the molded component assembly 10. According to several aspects, the multiple electronics components 16 are disposed on a second portion 23 of the first face 14 of the body 12. According to several aspects, the light emitting diodes 20, 20', 20", 20'", 20"" define side firing diodes, with visible light emitted from the light emitting diodes directed generally parallel to the first face 14.

Positioned proximate to each of the light emitting diodes 20, 20' are multiple individual through apertures 24, 24', 24", 24'", 24"" created in the body 12. According to several aspects each of the through apertures 24, 24', 24", 24'", 24"" are square or rectangular shaped, however any geometry can be selected. A separate through aperture 26 may also be provided proximate to the light emitting diode 22, which is similar to the through apertures 24, 24', 24", 24'", 24"" in function, but may have a smaller cross section. Also positioned on the first face 14 of the body 12 is a connector 28 which is connected to the electrical traces 18, 19. Multiple capacitive touch film contacts 30 are provided proximate to a space envelope of the connector 28. Multiple through apertures 32 are provided through the body 12 which frictionally receive pins discussed below.

A light guide 34 is molded from a single injection molding shot of an optically clear polymeric material such as polymethyl methacrylate (PMMA) which is transparent or translucent to allow light passage through the light guide 34. Multiple light emitting diode receiving pockets 36, 36', 36", 36'", 36"" are formed that open from a contact surface 38 defining a molded body facing side of the light guide 34, and are therefore recessed into or define recesses into the light guide 34. Each of the pockets 36, 36', 36", 36'", 36"" is sized to receive and partially surround one of the light emitting diodes 20, 20', 20", 20'", 20"" when the contact surface 38 of the light guide 34 directly contacts the first face 14 of the body 12. A separate pocket 40 is also created in the light guide 34 which receives the light emitting diode 22.

Multiple generally U-shaped cavities defining light outlets 42, 42', 42", 42'", 42"" are created through the light guide 34 each aligned with individual ones of the through apertures 24, 24', 24", 24'", 24"" when the light guide 34 is placed in direct contact with the first face 14 of the body 12. Multiple light lenses or light reflectors 44, 44', 44", 44'", 44"", co-molded of the PMMA material and homogeneously connected to the light guide 34 each extend into one of the light outlets 42. Each of the light reflectors 44, 44', 44", 44'", 44"" includes a planar reflector surface 45 oriented substantially parallel to the contact surface 38. When the light guide 34 is positioned on the body 12 each of the light reflectors 44, 44', 44", 44'", 44"" substantially overlaps one of the through apertures 24, 24', 24", 24'", 24"" with the light guide 34 press-fit onto pins described below extending from the first face 14 of the body 12. A separate light reflector 46 also co-molded of the PMMA material and homogeneously connected to the light guide 34 overlaps the through aperture 26 when the light guide 34 is positioned on the body 12.

Multiple male projections defining first pins 48 co-molded of the PMMA material and homogeneously connected to the light guide 34 extend upwardly as viewed in FIG. 1 away from an outer surface 50 of the light guide 34. A separate male projection defining an alignment pin 52 which is longer than the first pins 48 can also be provided. In addition to the first pins 48 extending from the outer surface 50, multiple male projections defining second pins 54, only one of which is partially visible in this view, extend downwardly away from the contact surface 38. Each of the second pins 54 is frictionally received in one of the through apertures 32 formed in the body 12 when the light guide 34 is press-fit onto the first face 14 of the body 12.

A reflector plate 56 of a polymeric material such as an injected resin or a stamped film is molded using a molding process. The reflector plate 56 is positioned in direct contact with the outer surface 50 of the light guide 34 and covers the electronics components 16, and directly contacts a portion of the first face 14 of the body 12. According to several aspects, the reflector plate 56 is white in color to reflect visible light created when the light emitting diodes 20, 20', 20", 20'", 20"", 22 are energized which would otherwise escape through the light guide 34 and return the light back into the light guide 34. When the light guide 34 is positioned on the body 12 a portion of the reflector plate 56 also directly contacts the planar reflector surface 45 of each of the light reflectors 44, 44', 44", 44'", 44'". Multiple filler members 58 are co-molded with and homogeneously extend from a lower surface 60 of the reflector plate 56. Each of the filler members 58 is sized to be slidably received in and to substantially fill one of the cavities defining the light outlets 42 extending through the light guide 34 when the lower surface 60 is brought into direct contact with the outer surface 50 of the light guide 34. The light outlets 42 created in the light guide 34 receive the filler members 58 which extend from the reflector plate 56 to add white reflective material of the reflector plate 56 directly into the light guide 34.

A first thickness 62 of the reflector plate 56 in in a first section 64 of the filler members 58 is less than a second thickness 66 defining a second section 68 of the reflector plate 56. A planar surface 70 is created in the second section 68 having the second thickness 66, and a partial cavity 72 is provided in the first section 64 having the filler members 58. The planar surface 70 directly contacts an area 74 of the first face 14 of the body 12 when the reflector plate 56 is brought into direct contact with each of the light guide 34 and the body 12, with the light guide 34 positioned within the partial cavity 72. Each of the first pins 48 of the light guide 34 are frictionally received in one of multiple through apertures 76 created in the reflector plate 56 to fix the reflector plate 56 onto the light guide 34. A full thickness body portion 78 of the reflector plate 56 is created outside of the partial cavity 72, which provides the planar surface 70.

Referring to FIG. 2 and again to FIG. 1, a completed assembly of the molded component assembly 10 provides the light guide 34 frictionally coupled to the body 12 using the second pins 54, and the reflector plate 56 overlayed onto and frictionally coupled to both the light guide 34 and the body 12 using the first pins 48 and the alignment pin 52. In the assembled condition, each of the light emitting diodes such as the light emitting diode 20 is received in one of the pockets such as the pocket 36 as will be described in greater detail in reference to FIGS. 6 through 8. Light generated by each light emitting diode as visible light is directed primarily toward the light reflectors of its associated light guide, such as from the light emitting diode 20 toward the light reflector 44, in the direction of a light arrow 80. Each light guide disperses light out via one of the through apertures 24, 24', 24", 24'", 24"", for example light from the light emitting diode 20 is dispersed through the light reflector 44 out via the through aperture 24. The openings provided in the light guide 34 via the light outlets 42 surrounding the light guides help limit light dispersion through only one of the through apertures via only one of the light guides, such as through the through aperture 24 via the light reflector 44.

Figure 2:
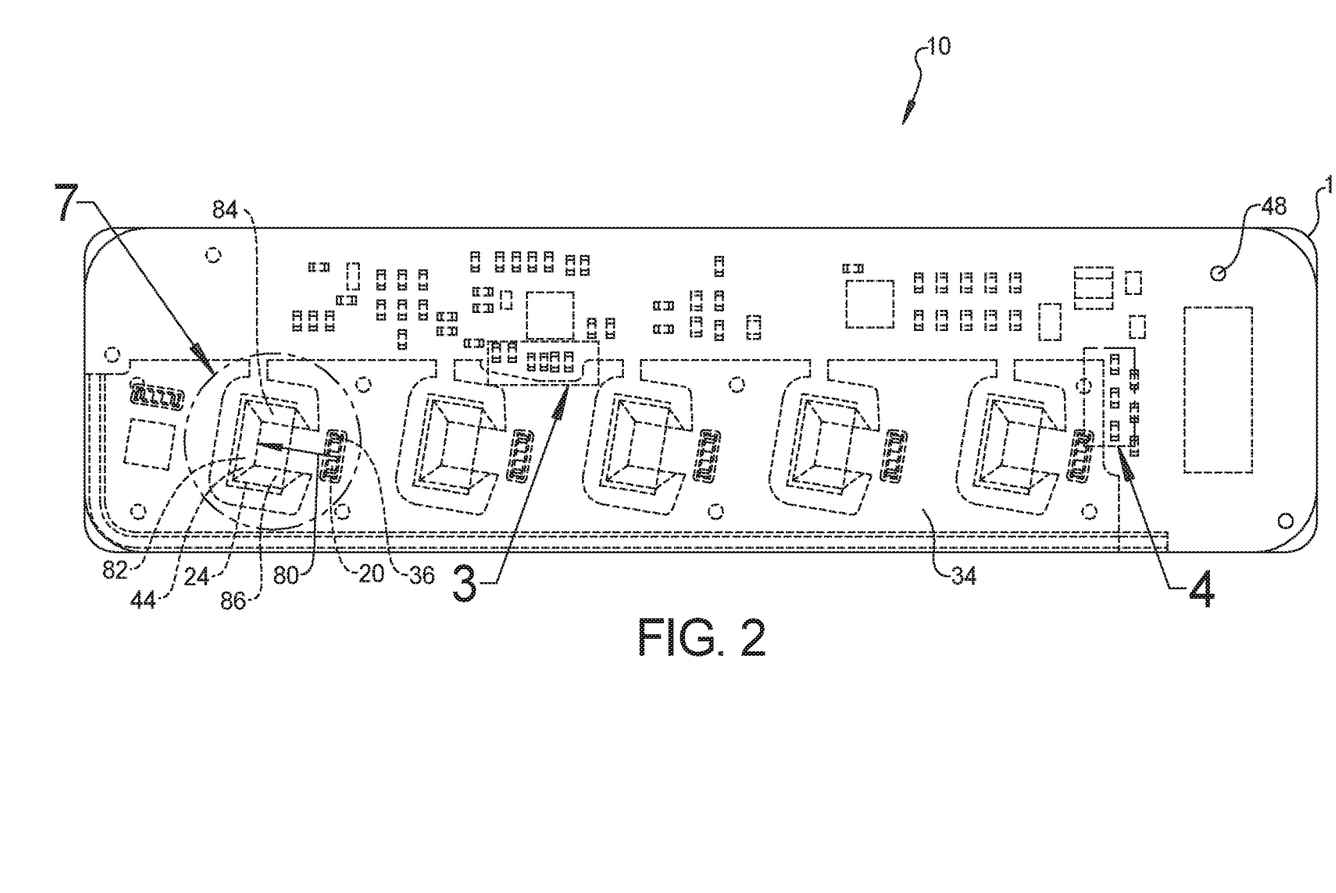
FIG. 2 is a top plan view of an assembled molded component assembly of FIG. 1.
Figure 9:
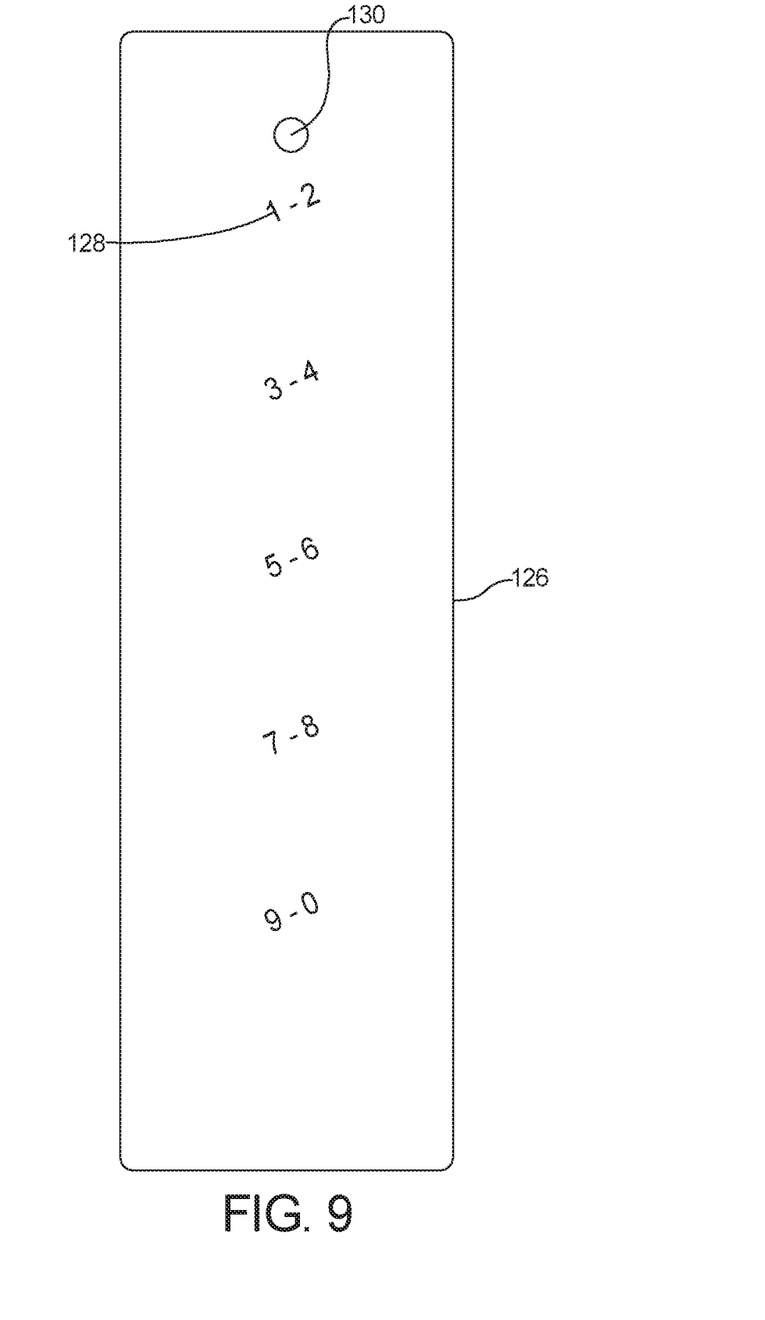
FIG. 9 is a bottom plan view of the assembled molded component of FIG. 1.

Light rays as visible light emitted from the light emitting diodes 20, 20', 20", 20'", 20"" reflect off multiple beveled surfaces of each of the light reflectors 44, including a first reflector surface 82, a second reflector surface 84 and a third reflector surface 86 which are oriented non-orthogonal to the contact surface 38, and which direct the light rays out the through apertures 24, 24', 24", 24'", 24"". Light rays emitted by the light emitting diode 22 are directed out the through aperture 26. The light rays as visible light pass through graphics created on a finish layer of an acrylonitrile butadiene styrene (ABS) plastic (shown and described in reference to FIG. 9) of the molded component assembly 10. The angles of the beveled surfaces 82, 84, 86 are each oriented approximately 45 degrees with respect to the contact surface 38 which is oriented parallel to the outer surface 50 of the light guide 34. The beveled surfaces 82, 84, 86 reflect and direct the light to intensify the light toward a center of each of the light reflectors 44. Visible light emitted by the light emitting diodes 20, 20', 20", 20'", 20"", 22 also reflects off the white reflector plate 56 back toward the light guide 34 and the body 12, and is thereby available to be reflected off the multiple beveled surfaces 82, 84, 86 and out the through apertures 24, 24+,24", 24'", 24"".

Referring to FIG. 3 and again to FIGS. 1 through 2, the second portion 23 of the body 12 having the electronics components 16 mounted thereon is generally not covered or contacted by the light guide 34. To encapsulate and environmentally protect the electronics components 16, a first polymeric material 88 is molded over the second portion 23 of the first face 14 encapsulating the electronics components 16 and contacting a portion of the light guide 34. According to several aspects, the light guide 34 includes a side surface 90 extending from the contact surface 38, having the first polymeric material 88 contacting a portion of the side surface 90. According to several aspects, the side surface 90 is oriented perpendicular to the contact surface 38. According to further aspects, a second polymeric material 92 is over-molded over the light guide 34 and at least partially over the first polymeric material 88.

Figure 3:
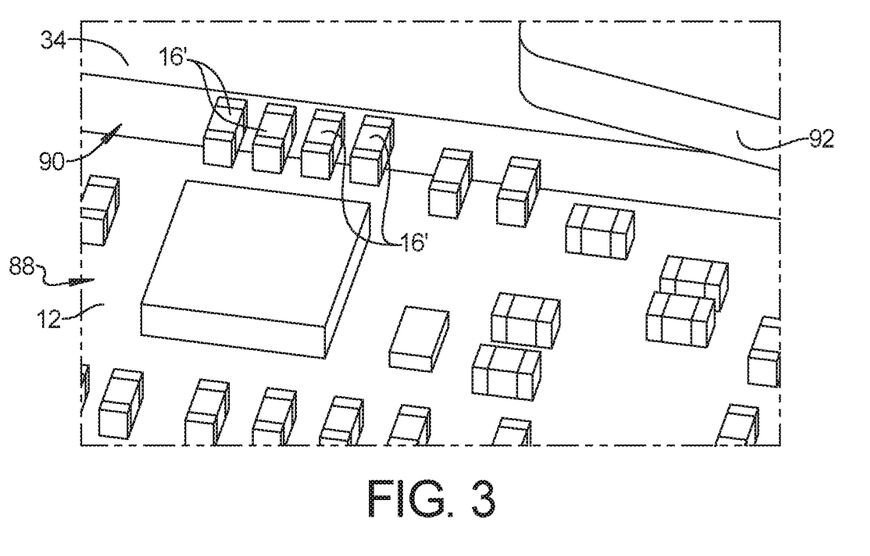
FIG. 3 is a rear perspective view of area 3 of FIG. 2.
Figure 4:
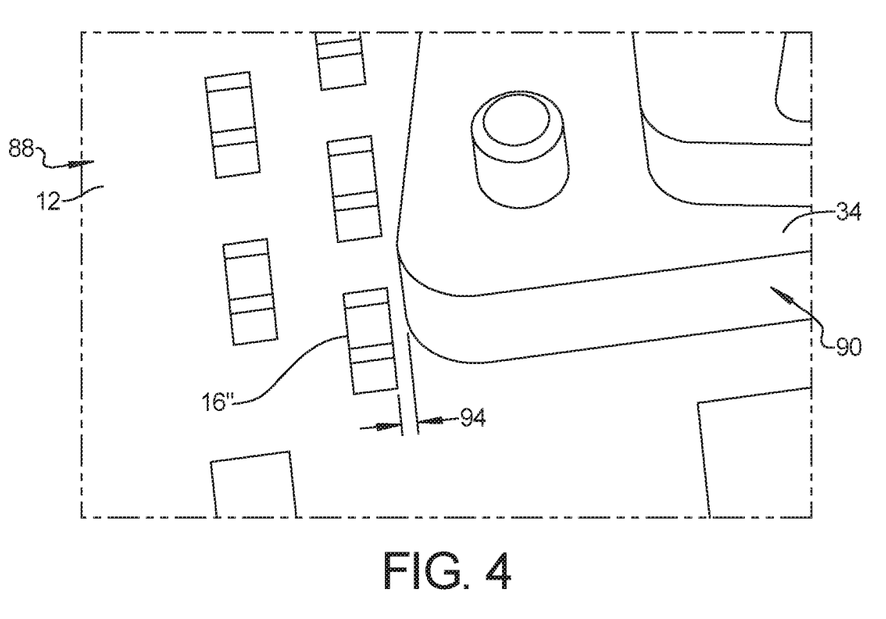
FIG. 4 is an end perspective view of area 4 of FIG. 2.

Referring to FIG. 4 and again to FIGS. 1 through 3, to the maximum extent possible, a minimum clearance 94 is maintained between the side surface 90 of the light guide 34 in its installed position on the body 12 and any of the electronics components 16 such as an exemplary electronic component 16". According to several aspects, the minimum clearance 94 is approximately 0.2 mm which provides for tolerance stack-up and thermal expansion between components.

Figure 5:
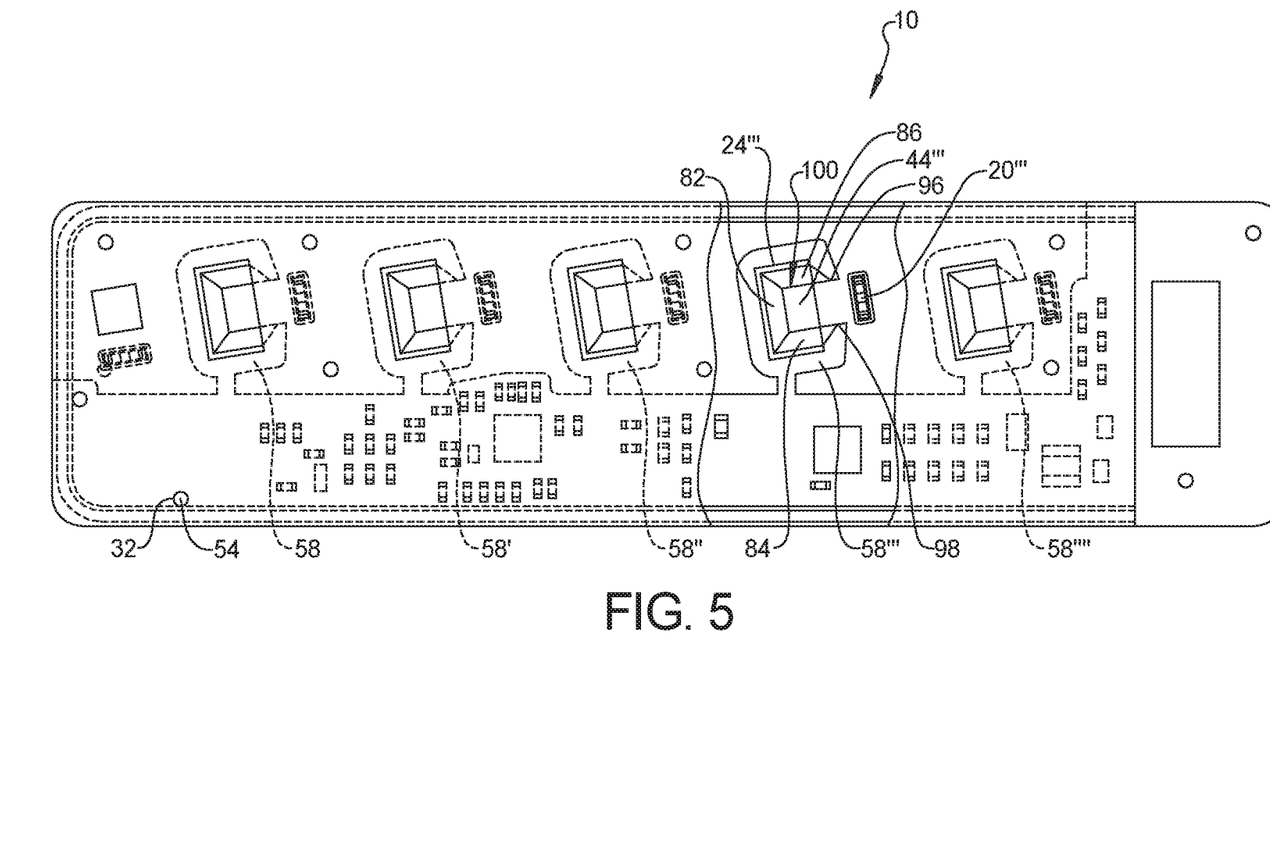
FIG. 5 is a bottom plan view of the molded component of FIG. 1.

Referring to FIG. 5 and again to FIGS. 1 through 4, each of the multiple filler members 58, 58', 58", 58''', 58'''' are shown in the installed positions. A partial thickness of the body 12 has been removed for clarity, presenting the filler member 58''', and the light reflector 44''' more clearly. The following discussion of the filler member 58''' and the light reflector 44''' therefore applies equally to all of the filler members and light reflectors. The filler member 58''' substantially surrounds the through aperture 24''' except between opposed end faces 96, 98 where light from the light emitting diode 20''' enters the light reflector 44'''. A distal end 100 of the light reflector 44''' defines a substantially flat face having a geometry that substantially matches a geometry of the through aperture 24''', and thereby covers the through aperture 24''' to create a light outlet. According to several aspects, the distal end 100 is positioned flush with the second face 15 of the body 12. According to further aspects, the distal end 100 is positioned at least partially within the through aperture 24''' but is spaced apart from the second face 15 of the body 12. Light generated by the light emitting diode 20''' enters the light reflector 44''', reflects off each of the beveled surfaces 82, 84, 86, and is dispersed from the distal end 100 defining the light outlet from the through aperture 24''' in a direction toward the viewer as shown in FIG. 5.

Referring generally to FIG. 6 and again to FIG. 1, the second reflector surface 84 and the third reflector surface 86 are each positioned proximate to and intersect with the first reflector surface 82. According to several aspects, the second reflector surface 84 and the third reflector surface 86 each include an edge 102, 104 respectively that is oriented parallel with the edge 102 or 104 of the other one of the second reflector surface 84 or the third reflector surface 86. According to several aspects, the first reflector surface 82, the second reflector surface 84 and the third reflector surface 86 define an edge 106 of the light guide. According to several aspects, the planar reflector surface 45 defines a fourth reflector surface positioned proximate to each of the first reflector surface 82, the second reflector surface 84 and the third reflector surface 86, with the fourth reflector surface 45 oriented substantially parallel to the contact surface 38.

With continuing reference to FIG. 6 and again to FIGS. 1 and 2, each of the light emitting diode receiving pockets 36, 36', 36", 36''', 36'''' has a shape corresponding to a shape of the light emitting diodes 20, 20', 20", 20''', 20'''', 22. According to several aspects, each of the pockets 36, 36', 36", 36''', 36'''' is substantially identical, therefore the following discussion of the first pocket 36 applies equally to the remaining pockets. With specific reference to FIG. 7, the first pocket 36 includes an open end 108 opening at the contact surface 38 defining the body facing side of the light guide 34. A closed end wall 110 of the first pocket 36 is embedded within a body 112 of the light guide 34. The first pocket 36 has a pocket depth 114 which is greater than a height of the light emitting diode 20 standing away from the face 14 of the body 12, and a width 116 of the first pocket 36 is greater than a width of the light emitting diode 20, such that the light emitting diode 20 can be freely received within the first pocket 36 without directly contacting an inside wall 118 of the first pocket 36. According to several aspects, the inside wall 118 defines an incident surface, with the incident surface having a texture or a pebbling to control transmission of the visible light to the light guide 34, for example by more widely dispersing incident light encountering the incident surface.

Figure 6:
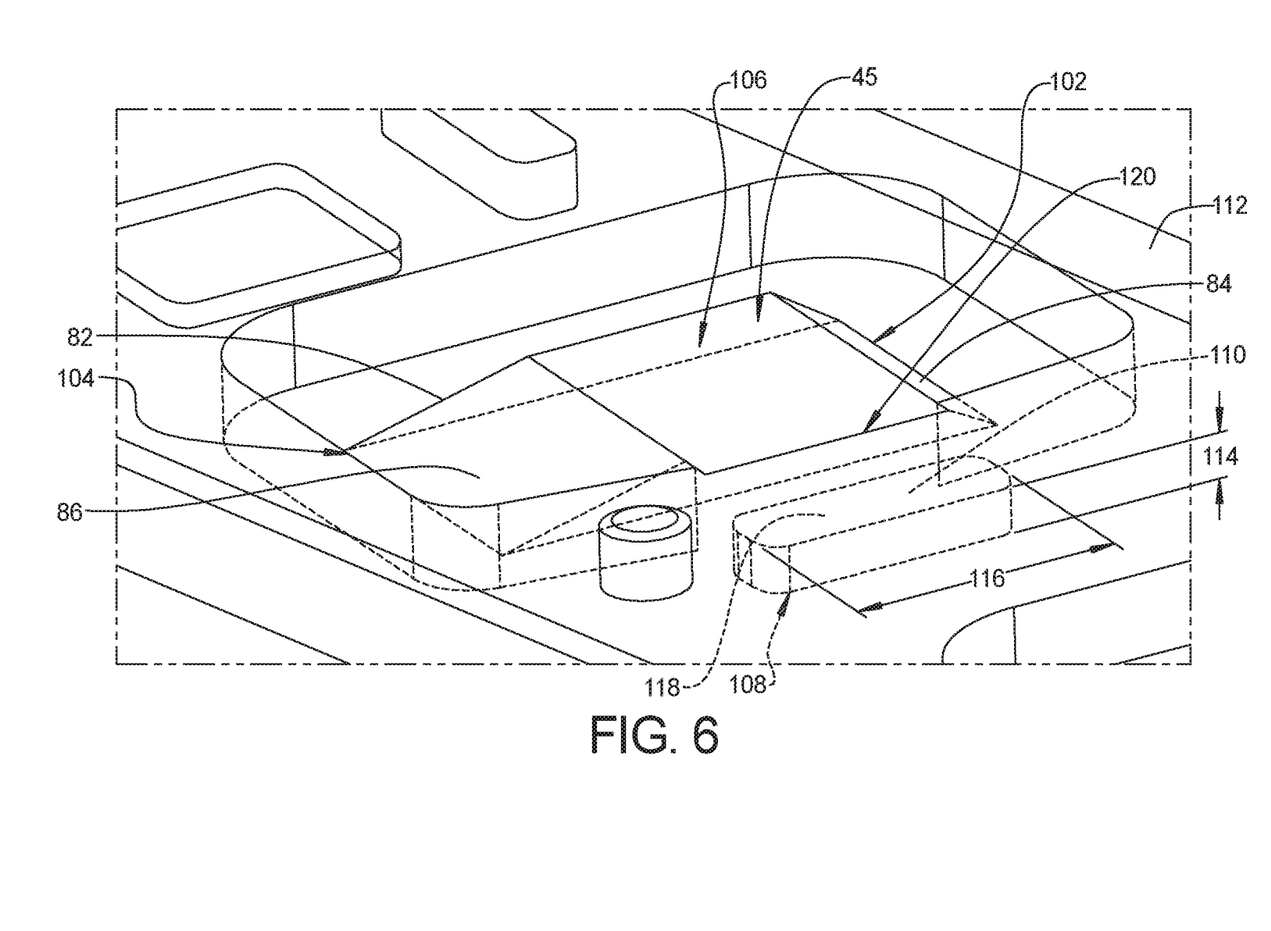
FIG. 6 is a top perspective view of area 6 of FIG. 1.
Figure 7:
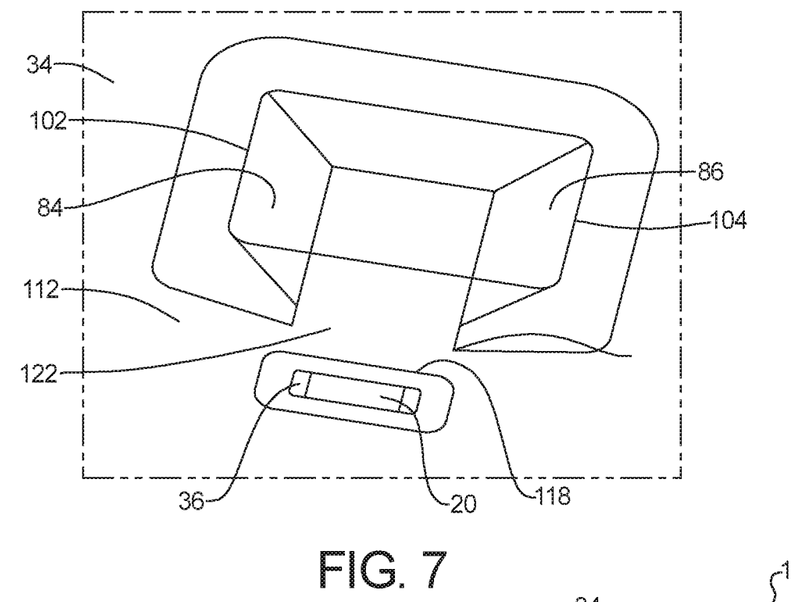
FIG. 7 is a top plan view of area 7 of FIG. 2.

With continuing reference to FIG. 6, a recess portion 120 may be formed in the light guide 34. According to several aspects, the fourth reflector surface 45 defines a portion of the recess portion 120.

Referring to FIG. 7 and again to FIGS. 1, 2 and 6, the light guide 34 includes multiple neck portions 122 each positioned between one of the light reflectors, such as the first light reflector 44 shown, and the body 112 of the light guide 34. Each neck portion 122 has a smaller width and/or a reduced cross sectional area compared to the body 112 and the light guide 34 and transmits visible light from one of the light emitting diodes 20, 20', 20", 20''', 20'''' to one of the light reflectors 44, 44', 44", 44''', 44''''.

Figure 8:
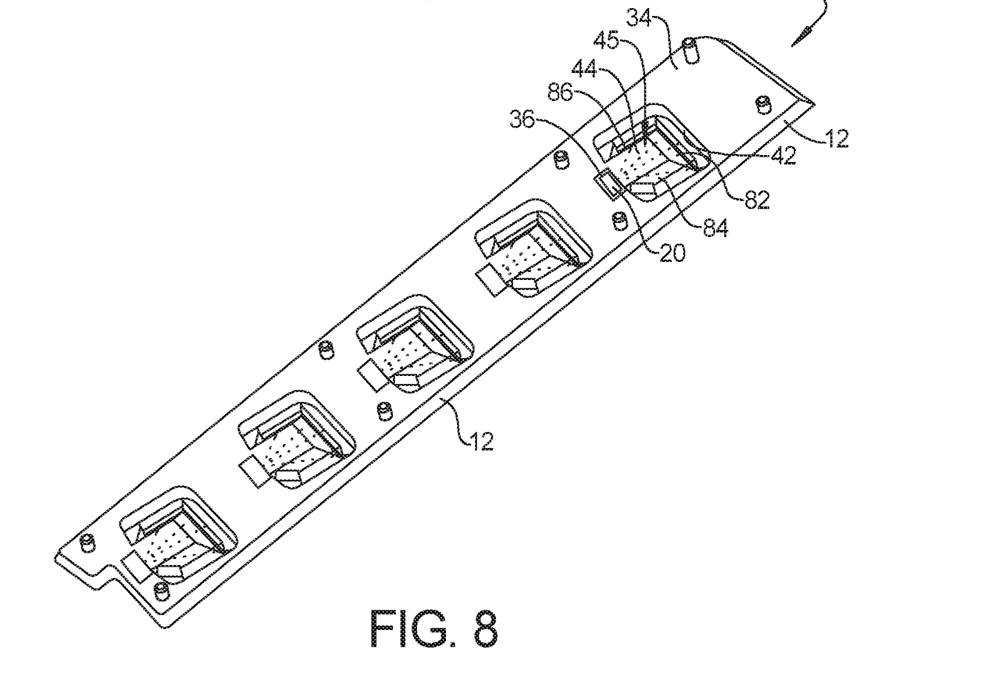
FIG. 8 is a top perspective view of a partial assembly having a light guide of the present disclosure positioned on a first portion of a printed circuit board.

Referring to FIG. 8 and again to FIGS. 1 and 2, a subassembly 124 includes the light guide 34 assembled on the molded body 12 of the printed circuit board using the pins 54 described in reference to FIG. 1. Light rays as visible light emitted from each of the light emitting diodes, such as from the exemplary light emitting diode 20 are reflected using the light reflectors 44, 44', 44", 44''', 44'''' into individual ones of the light outlets 42, 42', 42", 42''', 42''''. Light rays are transmitted into each light reflector and reflect off each of the first reflector surface 82, the second reflector surface 84 and the third reflector surface 86 of each of the light reflectors. Light directed upwardly and out through the fourth reflector surface 45 is back-reflected into the light guide 34 by the reflector plate 56 as previously described herein.

Referring to FIG. 9 and again to FIG. 1, to complete assembly of the molded component assembly 10, a polymeric substantially opaque film 126 is applied for example by adhesive bonding to the second face 15 of the printed circuit board or body 12. According to several aspects, the opaque film 126 contains a black ink, rendering the opaque film 126 black in color. Light generated by any of the light emitting diodes 20, 20', 20", 20''', 20'''' of the body 12 is blocked from passing through the opaque film 126 except at individual locations of multiple indicia 128. The indicia 128 are light transparent portions of the opaque film 126 which may be rendered as successive number pairs and are each individually aligned with one of the through apertures 24, 24', 24", 24''', 24'''' where maximum light enhancement is achieved by the light reflectors 44, 44', 44", 44''', 44'''. A separate window region 130 can be provided through the opaque film 126 for light generated by the light emitting diode 22. According to several aspects, the opaque film 126 can be an acrylonitrile butadiene styrene (ABS) plastic.

A molded component defining a molded component assembly 10 of the present disclosure offers several advantages. These include provision of multiple light reflectors in a light guide that each include multiple angular faces non-orthogonally oriented with respect to a contact face of the light guide. The angular faces reflect light from side firing light emitting diodes out through light outlets created in the light guide.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A molded component assembly, comprising:
    a printed circuit board with a first face and an oppositely facing second face;
    an electronics component mounted on a second portion of the first face;
    a light emitting diode mounted on a first portion of the first face;
    a light guide of a light translucent polymeric material positioned proximate to the light emitting diode, the light guide including:
        a contact surface directly contacting the first portion of the first face;
        a light outlet aligned to receive visible light emitted from the light emitting diode;
        an integrally formed light reflector positioned proximate to the light outlet and including at least a first reflector surface that is non-orthogonal to the contact surface to reflect light from the light emitting diode into the light outlet; and
    a first polymeric material molded over the second portion of the first face encapsulating the electronics component and contacting a portion of the light guide,
    wherein the printed circuit board includes a through aperture extending from the first face to the second face, with the light outlet aligned with the through aperture and a distal end of the light reflector defining a substantially flat face having a geometry that substantially matches a geometry of the through aperture, with the distal end positioned substantially flush with the second face of the printed circuit board.

2. The molded component assembly of claim 1, wherein:
    the printed circuit board includes multiple through apertures extending from the first face to the second face, with the light outlet aligned with one of the through apertures; and
    a distal end of the light reflector defines a substantially flat face having a geometry that substantially matches a geometry of individual ones of the through apertures, with the distal end spaced apart from the second face of the printed circuit board.

3. The molded component assembly of claim 1, wherein the at least a first reflector surface includes a second reflector surface and a third reflector surface that are each oriented non-orthogonal with the contact surface.

4. The molded component assembly of claim 3, wherein the second reflector surface and the third reflector surface are each positioned proximate to and intersect with the first reflector surface.

5. The molded component assembly of claim 3, wherein the second reflector surface and the third reflector surface each include an edge oriented parallel with the edge of the other one of the second or the third reflector surface.

6. The molded component assembly of claim 3, wherein the first reflector surface, the second reflector surface and the third reflector surface define an edge of the light guide.

7. The molded component assembly of claim 3, further including a fourth reflector surface positioned proximate to each of the first reflector surface, the second reflector surface and the third reflector surface, the fourth reflector surface oriented substantially parallel to the contact surface.

8. The molded component assembly of claim 1, wherein the light guide includes a light emitting diode receiving pocket recessed into the contact surface, the pocket having a shape corresponding to a shape of the light emitting diode and sized to receive the light emitting diode when the contact surface directly contacts the first portion of the first face.

9. The molded component assembly of claim 8, wherein the pocket includes an incident surface.

10. The molded component assembly of claim 9, wherein the incident surface includes a texture to control transmission of the visible light to the light guide.

11. The molded component assembly of claim 1, further including a recess portion formed in the light guide, the first reflector surface defines a portion of the recess portion.

12. The molded component assembly of claim 1, wherein the light guide includes a neck portion positioned between the light reflector and a body of the light guide, the neck portion having a smaller width than each of the body and the light reflector and transmitting visible light from the light emitting diode to the light reflector.

13. A molded component assembly, comprising:
    a printed circuit board with a first face and an oppositely facing second face, and multiple through apertures extending from the first face to the second face;
    multiple light emitting diodes mounted on a first portion of the first face;
    a light guide of a light translucent polymeric material positioned proximate to the light emitting diodes, the light guide including:
        a contact surface directly contacting the first portion of the first face;
        multiple light outlets, each aligned to receive visible light emitted from one of the light emitting diodes; and
        multiple integrally formed light reflectors, each extending into one of the light outlets and over one of the through apertures, and each including a first reflector surface, a second reflector surface and a third reflector surface each oriented non-orthogonal to the contact surface to reflect light from one of the light emitting diodes into one of the light outlets.

14. The molded component assembly of claim 13, further including a fourth reflector surface positioned proximate to each of the first reflector surface, the second reflector surface and the third reflector surface, the fourth reflector surface oriented substantially parallel to the contact surface, wherein the first reflector surface, the second reflector surface, the third reflector surface and the fourth reflector surface together define an edge of the light guide.

15. The molded component assembly of claim 13, wherein each of the light emitting diodes defines a side-firing diode having visible light emitted from the light emitting diodes directed generally parallel to the first face.

16. The molded component assembly of claim 13, wherein each of the multiple light reflectors is homogeneously connected to the light guide and each includes a neck portion extending the light reflector at least partially into one of the through apertures.

17. The molded component assembly of claim 13, further including:
- multiple electronics components mounted on a second portion of the first face;
- a first polymeric material molded over the second portion of the first face encapsulating the electronics components and contacting a portion of the light guide;
- a second polymeric material over-molded over the light guide and over the first polymeric material; and
- a substantially opaque layer of a polymeric material positioned over the second face of the printed circuit board having translucent openings positioned over each of the through apertures, the translucent openings defining successive number pairs.

18. A molded component assembly, comprising:
- a printed circuit board with a first face and an oppositely facing second face, and multiple through apertures extending from the first face to the second face;
- multiple side firing light emitting diodes mounted on a first portion of the first face each directing visible light substantially parallel to the first face;
- multiple electronics components mounted on a second portion of the first face;
- a light guide of a light translucent polymeric material having: a contact surface; multiple light reflectors each extending at least partially into one of the through apertures to create a light outlet from each of the light reflectors; and multiple light emitting diode receiving pockets recessed into the contact surface, each sized to receive one of the light emitting diodes when the contact surface directly contacts the first portion of the first face, with visible light from the light emitting diodes transmitted through the light reflectors and out via each light outlet; and
- the multiple light reflectors each include multiple beveled surfaces to reflect the visible light to the light outlets.

\* \* \* \* \*